United States Patent [19]

Wack et al.

[11] Patent Number: 5,486,314

[45] Date of Patent: Jan. 23, 1996

[54] CLEANING AGENT CONTAINING GLYCOL ETHERS

[75] Inventors: Oskar K. Wack, Stammham-Westerhofen; Martin Hanek, Hilpoltstein, both of Germany

[73] Assignee: O. K. Wack Chemie GmbH, Germany

[21] Appl. No.: 92,707

[22] Filed: Jul. 16, 1993

[30] Foreign Application Priority Data

Aug. 7, 1992 [EP] European Pat. Off. ............. 92113503
Aug. 7, 1992 [EP] European Pat. Off. ............. 92113504

[51] Int. Cl.$^6$ .................... C11D 7/32; C11D 7/26; C11D 7/50; C23G 5/036; C23G 5/02

[52] U.S. Cl. ............. 252/542; 252/153; 252/162; 252/170; 252/171; 252/174.21; 252/DIG. 8

[58] Field of Search ............. 252/162, 153, 252/170, 171, 174.21, 174.22, 542, 547, 544, DIG. 8

[56] References Cited

U.S. PATENT DOCUMENTS

| | | | |
|---|---|---|---|
| 4,592,787 | 6/1986 | Johnson | 134/38 |
| 5,015,410 | 5/1991 | Sullivan | 252/166 |
| 5,034,148 | 7/1991 | Black | 252/142 |
| 5,106,525 | 4/1992 | Sullivan | 252/162 |
| 5,190,595 | 3/1993 | Ameen et al. | 134/40 |

FOREIGN PATENT DOCUMENTS

| | | |
|---|---|---|
| 0376367 | 7/1990 | European Pat. Off. . |
| 0426943 | 5/1991 | European Pat. Off. . |
| 0587917 | 3/1994 | European Pat. Off. . |
| 1546075 | 2/1970 | Germany . |
| 3232915 | 3/1984 | Germany . |
| 3723402 | 1/1988 | Germany . |
| 3844183 | 7/1990 | Germany . |
| 4130494 | 4/1993 | Germany . |
| 9305637 | 4/1993 | Germany . |
| 4314365 | 11/1993 | Germany . |
| 1149981 | 6/1987 | Japan . |
| 9306204 | 4/1993 | WIPO . |

OTHER PUBLICATIONS

Leiterplattentechnik, Galvanotechnik, D–7968 Saulgau, 83 (1992) Nr. 4 entitled "FCKW–freie Reinigung: Medien–Anlagen–Konzepte" by Dr. M. Hanek & Dr. R. Schreinert, D–8070 Ingolstadt, pp. 1370–1380.

Primary Examiner—Paul Lieberman
Assistant Examiner—Lorna M. Douyon
Attorney, Agent, or Firm—Lalos & Keegan

[57] ABSTRACT

A cleaning agent composition and method, especially for cleaning electronic components, optical parts, and circuit boards. The liquid agent is completely CFC-free and biologically harmless. The composition includes a dipropylene glycol monoether and one or more of the following: N-alkyllactam; dihydro-2(3H)-furanone; a polypropylene glycol ether; $R_4$—CH(—OH)—$CH_2$—$NH_2$; $N(R_5)_3$; $R_6$—N[($CH_2CH_2O)_n$H] wherein $R_4$ is a chain of 1–6 carbons, $R_5$ is a chain of 2–18 carbons, $R_6$ is a chain of 8–18 carbons and n is a number between 2 and 25.

13 Claims, No Drawings

CLEANING AGENT CONTAINING GLYCOL ETHERS

The invention relates to a cleaning agent, especially to a cleaning liquid used for the cleaning of electronic components, circuit boards, electronic assembly units, and precision mechanics or optical parts.

Electronic circuit boards are cleaned after the components have been mounted thereon, and the components have been soldered. Residues or films of grease, resins and the like often increase the resistance between individual electronic components and could lead to the malfunction of the whole circuit. The high density of the components on modern circuit boards further increases the problems encountered.

For cleaning the components and the printing boards in the past, compositions containing chlorofluorocarbons CFC have been used. Due to the problems now recognized to be caused by CFC, i.e., ozonedepletion, it is necessary to avoid the further use of CFC.

It is therefore one object of the invention to propose a cleaning agent which is free of CFC.

It is a further object of the invention to propose a cleaning agent for electronic components which is free of CFC and additionally contains no halogens and does not harm the environment.

Another object of the invention is to provide a CFC-free cleaning agent having an outstanding cleaning performance.

Still another object of the invention is to provide a cleaning agent for electronic components and optical parts which has a high flash point so that explosion-proof equipment is not required.

It is still another object of the invention to propose a cleaning agent for electronic components and/or optical components having biologically degradable components.

These objects are met by the cleaning agent as claimed in claim 1.

According to the invention there is described a cleaning liquid for the use in cleaning electronic assembly units and optical components, said agent containing no CFC.

The general composition of a cleaning agent according to the invention is: 10–90% by weight of a dipropylene glycol monoether of the formula:

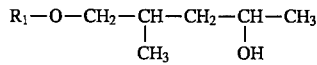

as carrying agent, whereby $R_1$ is chain of carbon atoms of a length between 1 and 6 atoms, and one or more of the following:

30–70% per weight of N-alkyl-lactame of the formula:

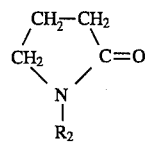

whereby $R_2$ is chain of carbon atoms of a length between 1 and 10 atoms,

10–70% per weight of dihydro -2(3H) - furanone, and

10–50% per weight of a polypropylene glycol ether of the formula:

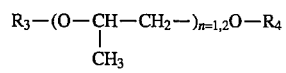

whereby $R_3$ is a chain of carbon atoms of a length between 1 and 6, and $R_4$ is a chain of hydrogen or carbon atoms of a length between 1 and 6 atoms.

One of the cleaning liquids according to the invention which overcomes the problems stated above consists of a mixture comprising at least 10–90% by weight of a dipropylene glycol ether as carrying agent and 30–70% per weight N-methyl lactame or an agent of 10–30% per weight taken out of the group consisting of propylene glycol methyl ether, propylene glycol ethyl ether, and the corresponding diethers.

One advantageous example of a special cleaning liquid contains 20% per weight ethoxypropoxypropanol, 50% per weight n-methyl-2-pyrrolidone and 30% per weight n-butoxy-propanol. This mixture has been found to be especially suited to dissolve grease, oil, flux agent residues and soldering pastes.

Another advantageous mixture contains 80% per weight ethoxypropoxypropanol as carrying agent, and 20% per weight propylene glycol methylether. This cleaning liquid is especially used for cleaning conventional electronic boards or solder frames.

A mixture of 60% per weight n-methyl-2-pyrrolidone, 20% per weight ethoxypropoxypropanol, and 20% per weight dihydro - 2(3H) -furanone has been found as suited in cleaning screens and to remove epoxid resins.

Also very effective for cleaning printing screen masks from soldering residues is a mixture of 30% per weight n-butoxypropanol, 50% per weight propylene glycol methylether, 5% per weight methoxyhexanone, and 15% per weight propylene glycol methyl ether acetate.

Another special composition is a carrier compound, said carrier compound being up to 90% and preferably 10–90% by weight of a dipropylene glycol monoether of the common formula

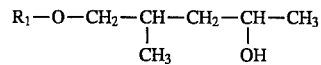

whereby $R_1$ is chain of carbon atoms of a length between 1 and 6 atoms,

10–50% per weight of a polypropylene glycol ether of the formula:

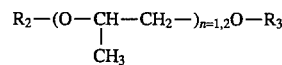

whereby $R_2$ is a chain of carbon atoms of a length between 1 and 6, and $R_3$ is a chain of hydrogen or carbon atoms of a length between 1 and 6 atoms, and 2–15% per weight of an active substance selected from one of the following compounds or a mixture thereof:

a. Compounds of the formula

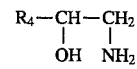

whereby $R_4$ is a chain of 1 to 6 carbon atoms b. Compounds of the formula $N(R_5)_3$ whereby $R_5$ is a chain of 2 to 18 carbon atoms, c. Compounds of the formula $R_6\text{- N }[(CH_{2\text{-}CH2}O)_nH]$ whereby $R_6$ is a chain of 8 to 18 carbon atoms, and n is number between 2 and 25.

The great advantage of this cleaning agent in comparison to the cleaning agents according to the prior art is that it is possible to clean electronic circuit boards of any residue of flux agents having few solids. Said flux agents with low solids are introduced into electronic production to avoid a cleaning by CFCs. Due to the prohibition of CFCs, many manufacturers only use soldering means without solids or with only few solids so that the cleaning process can be reduced. Nevertheless, a certain number of the circuit boards produced must still be cleaned. Of course, no manufacturer of circuit boards or user of such cleaning agents is interested in applying different flux agents depending on whether the boards have to be cleaned or not. The product according to the invention is offered for the first time as a cleaning agent that is able to remove the residue without leaving an undesirable visible white film that mars the optical appearance and the aesthetic look of the circuit boards.

A further special composition of the cleaning liquid according to the invention that overcomes the problems stated above consists of a mixture comprising:

80% by weight of ethoxypropoxypropanol,
15% by weight dipropylene glycol dimethyl ether, and
5% by weight aminobutanol.

All these cleaning mixtures are completely free of CFC and additionally have the following advantages:

a) No water is wasted since according to the invention there is provided a semiaqueous process for cleaning the components, said process generating absolutely no waste water due to the closed loop system, b) outstanding cleaning performances, c) very good dissolution of flux agents and oils, d) cleaning process free of residual waste gases and effluents, e) high flash point requiring no explosion-proof equipment when temperatures of 40° C. to 60° C. are not exceeded, f) minimal evaporation loss, g) no toxic components and absolutely no health hazard, h) completely halogen-free (CFC) and therefore there is presented absolutely no threat of erosion to the ozone layer nor danger of contamination to the water supply, i) biologically degradable components, j) the cleaning process requires only ca. 20–25% of the amount of CFC cleaning media previously used. This results in a ca. 20–30% reduction in the costs of chemicals as compared with the use of CFC, k) the mixture consists of highly effective solvents with very good water solubility to ensure the easy removal of oil, grease and resin residues and l) the mixture, free of wetting agent, removes even ionic compounds, such as flux activators.

For applying the cleaning agent there is herein provided a process having at least three stages. In stage 1, the items to be cleaned are immersed into a bath consisting of one of the mixtures described above. Depending on the special materials to be cleaned and the special residues or film present, the most suitable mixture will be used. It could be an advantage to test some of the mixtures until having found the mixture having the best cleaning properties for any special case. The cleaning liquid is of room temperature or in a temperature of about 40° to 50° C. The items will be kept in this bath for a period of usually less than two minutes. If necessary the cleaning process can be assisted by ultrasonic exposure or other suitable mechanical movements.

Filters are provided to retain the undissolved particles. The solution can be used until the impurity has reached a concentration of about 20%. Then the solution will be returned to the producer for repreparation.

The second step is water rinsing to remove the cleaning solution. The rinsing water is kept in a closed loop circulation and is pumped through resin adsorbers in a mixed-bed exchanger. If necessary, this rinsing step can be followed by a further rinsing step using deionized and/or demineralized water. Most suited as adsorber resins are styrol resins. In the last step the items will be dried by a warm air stream or with warm air at 60° C. to 70° C. and a pressure of 2 bar.

The invention will be disclosed in further detail by the following examples and by the drawing, wherein,

EXAMPLE 1

A mixture is prepared consisting of 20% per weight ethoxypropoxypropanol, 50% per weight n-methyl-2-pyrrolidone and 30% per weight N-butoxy-propanol. The individual components are added together at room temperature and stirred.

The mixture obtained has the following properties:

Density: 0.96±0.02 g/cm³

Surface-tension: 31.7 mN/m

Boiling-range: 170°–200° C.

Flash point 75° C.

The following matrix shows the efficiency of different cleaning liquids, compared with mixture A of the present invention.

EXAMPLE 2

A mixture is prepared consisting of 80% per weight ethoxypropoxypropanol and 20% propylene glycol methyl-ether. The

| cleaning method | Kind of pollution | | | | temperature |
| --- | --- | --- | --- | --- | --- |
| | grease | ionically dissociable compositions | resins | harmful to ozon layer | |
| CFC/alcohol | + | O | O | yes | 25° C. |
| alcohol | + | O | O | no | 25° C. |
| water/alcalic | O | + | O | no | 25° C. |
| terpene/water | + | + | O | no | 25° C. |
| butyl-glycol/alcohol | + | O | O | no | 25° C. |
| mixture A/rinsing with water | + | + | + | no | 25° C. |

+ means "very good", O means "good", − means "bad"

individual components are added together at room temperature and stirred.

The mixture obtained has the following properties:

Density: 0.93±0.02 g/cm³

Surface-tension: 28.3 mN/m

Boiling-range: 120°–228° C.

Flash point 61° C.

The mixture thus obtained has been found to have especially good properties for resolving flux residues, oils, grease and soldering pastes without affecting electronic components, such as resistors, capacitors, and integrated circuits.

EXAMPLE 3

In the last example a mixture is prepared consisting of 60% n-methyl-2-pyrrolidone, 20% ethoxypropoxypropanol, and 20% dihydro-2(3H)-furnanone. The individual components are added together at room temperature and stirred.

The mixture obtained has the following properties:
Density: 1.02±0.02 g/cm³
Surface-tension: 36.3 mN/m
Boiling-range: 200°–228° C.
Flash point: 89° C.

The special field of this mixture is the disposal of epoxid resins.

EXAMPLE 4

A mixture is prepared consisting of 30% n-butoxy-propanol, 50% propylene glycol methylether, 5% methoxyhexanone, and 15% propylene glycol methyl ether acetate. The individual components are added together at room temperature and stirred as in the foregoing examples.

The mixture obtained has the following properties:
Density: 0.91±0.02 g/cm³
Boiling-range: 120°–170° C.
Flash point: 37° C.

The special use of this mixture is spray cleaning screen printing masks to remove soldering pastes and printing pastes.

EXAMPLE 5

A mixture is prepared consisting of 80% by weight of ethoxypropoxypropanol, 15% by weight dipropylene glycol dimethyl ether, and 5% by weight aminobutanol. The individual components are added together at room temperature and stirred.

The mixture obtained has the following properties:
Density: 0.93±0.02 g/cm³
Surface-tension: 29.0 mN/m
Boiling-range: 175°–228° C.
Flash point: 73° C.

The obtained mixture has been found as especially suited in cleaning electronic components to remove flux agents with few solids. Further applications are the cleaning of optical parts and mechanical components. The properties in dissolving oil, grease, and soldering pastes have been found to be excellent.

Four tanks may be used. In a first tank there is provided an ultrasonic radiator with standard intensity ultrasonics. Depending upon what special items are to be cleaned, this first tank is filled with a bath of one of the mixtures according to the above described examples, the most suitable mixture is found out by preliminary tests. The items to be cleaned are immersed into this first tank for about 60 to 120 seconds. Simultaneously they are exposed to the ultrasonic radiation.

Thereafter the items are taken out and immersed into a second tank containing rinsing water. The following washing in the second tank with demineralized or deionized water helps to avoid any residue on the items when thereafter dried in a third tank by a stream of hot air. The cleaning mixtures according to the invention are filtered by a filter. The rinsing water is pumped in closed loops over adsorber resins which can be regenerated when saturated by the residues brought into the bath. Styrol resins have been found out as being most suited to be used in connection with these special cleaning liquids.

In a three stage device there are three tanks. In a first tank there is provided an ultrasonic radiator with standard intensity ultrasonics. Depending upon what special items are to be cleaned, this first tank is filled with a bath of one of the mixtures according to the above described examples, the most suited mixture is again found out by tests. The items to be cleaned are immersed into this first tank for about 60 to 120 seconds. Simultaneously they are exposed to the ultrasonic radiation.

Thereafter the items are taken out and immersed into a second tank containing rinsing water. Thereafter they are dried in tank by a stream of hot air.

The cleaning mixtures according to the invention are filtered by filter. The rinsing water is pumped in a closed loop absorber resins which can be regenerated when saturated by the residues brought into the bath.

We claim:

1. A cleaning agent for precision mechanics, optical and electronic components, circuit boards and electronic assembly units consisting of:

10–90% by weight of a dipropylene glycol monoether of the formula:

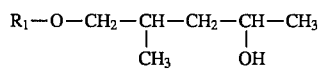

as carrying agent, whereby $R_1$ is a chain of carbon atoms of a length between 1 and 6 atoms, and a compound selected from the group consisting of, a) 30–70% per weight of N-alkyl-lactame of the formula:

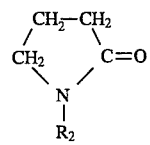

whereby $R_2$ is chain of carbon atoms of a length between 1 and 10 atoms,
b) 10–70% per weight of dihydro-2(3H) - furanone and
c) 10–50% per weight of at least one polypropylene glycol ether of the formula:

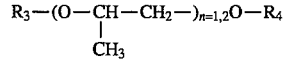

whereby $R_3$ is a chain of carbon atoms of a length between 1 and 6, and $R_4$ is hydrogen or a chain of carbon atoms of a length between 1 and 6 atoms.

2. Cleaning agent according to claim 1, consisting of at least dipropylene glycol ether as carrying agent and 30–70% per weight n-alkyl lactame or an agent of 10–30% per weight from the group consisting of propylene glycol methyl ether, propylene glycol ethyl ether and the corresponding diethers.

3. Cleaning agent according to claim 1, consisting of 10–30% per weight dipropylene glycol diether, 30–70% per weight a n-alkyl lactame and 10–40% per weight a polypropanol glycol ether selected from the group consisting of ethoxy-propanol, propoxypropanol, ethoxypropoxypropanol, and butoxy-propanol.

4. Cleaning agent according to claim 1, consisting of 10–40% per weight propylene glycol methylether or propylene glycol ethylether or a corresponding diether thereof.

5. Cleaning agent according to claim 4, consisting of 10–40% per weight ethoxypropoxypropanol and 20% per weight propylene glycol methylether.

6. Cleaning agent according to claim 1, consisting of 50–65% per weight n-methyl-2-pyrrolidone, and 10–25% per weight dihydro - 2(3H) - furanone.

7. Cleaning agent according to claim 1, consisting of 60% per weight n-methyl-2-pyrrolidone, and 20% per weight dihydro - 2(3H) - furanone.

8. Cleaning agent consisting of 20% per weight ethoxypropoxypropanol, 50% per weight n-methyl-2-pyrrolidone and 30% per weight n-butoxy-propanol.

9. Cleaning agent consisting of 30% per weight n-butoxypropanol, 50% per weight propylene glycol methylether, 5% per weight methoxyhexanone, and 15% per weight propylene glycol methyl ether acetate.

10. A cleaning agent for precision mechanics, optical and electronic components, circuit boards and electronic assembly units consisting of:

a carrier compound, said carrier compound being a dipropylene glycol monoether of the common formula

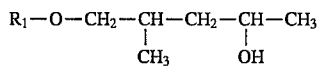

whereby $R_1$ is chain of carbon atoms of a length between 1 and 6 atoms,

10–50% per weight of a polypropylene glycol ether of the formula:

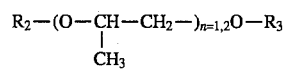

whereby $R_2$ is a chain of carbon atoms of a length between 1 and 6, and $R_3$ is hydrogen or a chain of carbon atoms of a length between 1 and 6 atoms, and 2–15% per weight of an active substance selected from one of the following compounds or a mixture thereof:

a. Compounds of the formula

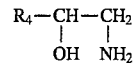

whereby $R_4$ is a chain of 1 to 6 carbon atoms b. Compounds of the formula $N(R_5)_3$ whereby $R_5$ is a chain of 2 to 18 carbon atoms, c. Compounds of the formula $R_6$-N $[(CH_2-CH_2O)_nH]$ whereby $R_6$ is a chain of 8 to 18 carbon atoms, and $1<n<26$.

11. Cleaning agent according to claim 10, wherein the polypropylene glycol ether is dipropylene glycol dimethyl ether.

12. Cleaning agent according to claim 10, wherein the active substance is 1-amino, 2-butanol.

13. Cleaning agent consisting of

80% by weight of ethoxypropoxypropanol,

15% by weight dipropylene glycol dimethyl ether, and

5% by weight 1-amino, 2-butanol

* * * * *